(12) United States Patent
Augendre et al.

(10) Patent No.: US 10,147,788 B2
(45) Date of Patent: Dec. 4, 2018

(54) PROCESS FOR FABRICATING A FIELD EFFECT TRANSISTOR HAVING A COATING GATE

(71) Applicant: Commissariat a l'energie atomique et aux energies alternatives, Paris (FR)

(72) Inventors: Emmanuel Augendre, Montbonnot (FR); Remi Coquand, Les Marches (FR); Shay Reboh, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/782,105

(22) Filed: Oct. 12, 2017

(65) Prior Publication Data
US 2018/0108733 A1 Apr. 19, 2018

(30) Foreign Application Priority Data

Oct. 13, 2016 (FR) ..................................... 16 59942

(51) Int. Cl.
*H01L 29/06* (2006.01)
*H01L 29/165* (2006.01)
(Continued)

(52) U.S. Cl.
CPC .... *H01L 29/0673* (2013.01); *H01L 21/02529* (2013.01); *H01L 21/02532* (2013.01);
(Continued)

(58) Field of Classification Search
CPC combination set(s) only.
See application file for complete search history.

(56) References Cited

U.S. PATENT DOCUMENTS

| 9,397,179 | B1 | 7/2016 | Seo |
| 2014/0042386 | A1 | 2/2014 | Cea et al. |
| 2014/0225065 | A1 | 8/2014 | Rachmady et al. |
| 2015/0144880 | A1 | 5/2015 | Rachmady et al. |

(Continued)

FOREIGN PATENT DOCUMENTS

| EP | 3 070 744 A1 | 9/2016 |
| WO | WO 2013/095650 A1 | 6/2013 |
| WO | WO 2013/095651 A1 | 6/2013 |

OTHER PUBLICATIONS

French Preliminary Search Report dated Jul. 11, 2017 in French Application 16 59942 filed on Oct. 13, 2016 (with English Translation of Categories of Cited Documents and Written Opinion).

*Primary Examiner* — Ratisha Mehta
(74) *Attorney, Agent, or Firm* — Oblon, McClelland, Maeir & Neustadt, L.L.P.

(57) ABSTRACT

A process for fabricating a gate-wrap-around field-effect transistor is provided, including: providing a superposition of first to third nanowires, each made of a semiconductor, the second nanowire being subjected to a strain along its longitudinal axis, a median portion of the first to third nanowires being covered by a sacrificial gate; forming voids by removing a portion of the first and third nanowires that is intermediate between their ends and their median portion, while preserving the superposition of the first to third nanowires level with the ends and under the sacrificial gate; forming an electrical insulator in the voids around the second nanowire; removing the sacrificial gate and the median portion of the first and third nanowires; and forming a gate electrode wrapped around the median portion of the second nanowire.

14 Claims, 6 Drawing Sheets

Figure 1:
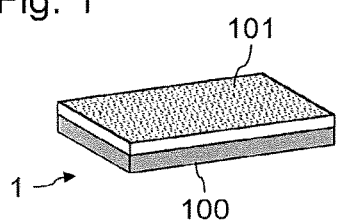

(51) Int. Cl.
*H01L 29/66* (2006.01)
*H01L 21/02* (2006.01)
*H01L 29/167* (2006.01)
*H01L 21/265* (2006.01)
*H01L 21/306* (2006.01)
*H01L 29/10* (2006.01)
*H01L 29/423* (2006.01)
H01L 21/311 (2006.01)
H01L 29/16 (2006.01)

(52) U.S. Cl.
CPC .. *H01L 21/02576* (2013.01); *H01L 21/02579* (2013.01); *H01L 21/26513* (2013.01); *H01L 21/30604* (2013.01); *H01L 29/1033* (2013.01); *H01L 29/165* (2013.01); *H01L 29/167* (2013.01); *H01L 29/42392* (2013.01); *H01L 29/66545* (2013.01); *H01L 29/66742* (2013.01); *H01L 21/31111* (2013.01); *H01L 29/1608* (2013.01); *H01L 29/6653* (2013.01); *H01L 29/66068* (2013.01)

(56) References Cited

U.S. PATENT DOCUMENTS

| | | |
|---|---|---|
| 2015/0325648 A1 | 11/2015 | Cea et al. |
| 2016/0027870 A1* | 1/2016 | Cheng ................. H01L 29/0673 257/347 |
| 2016/0079422 A1 | 3/2016 | Rachmady et al. |
| 2016/0276494 A1 | 9/2016 | Barraud et al. |
| 2017/0069481 A1* | 3/2017 | Doris ................. H01L 21/0228 |
| 2017/0141239 A1 | 5/2017 | Cea et al. |

* cited by examiner

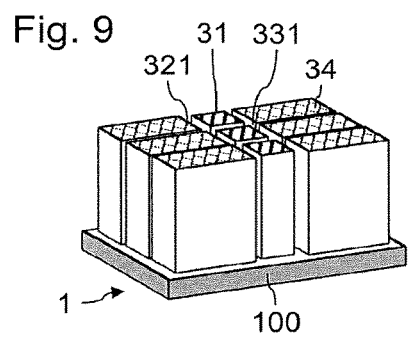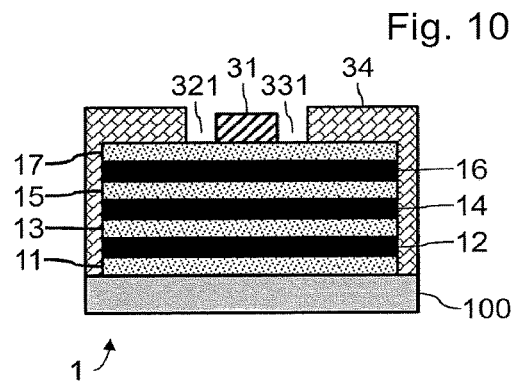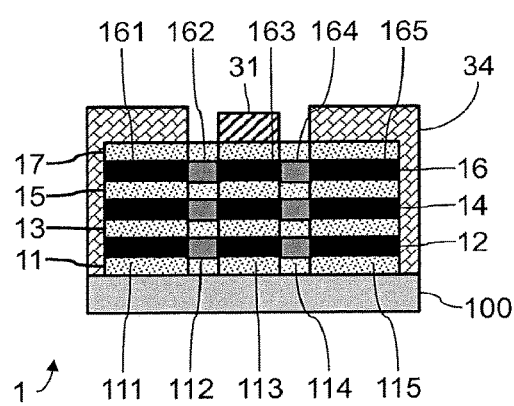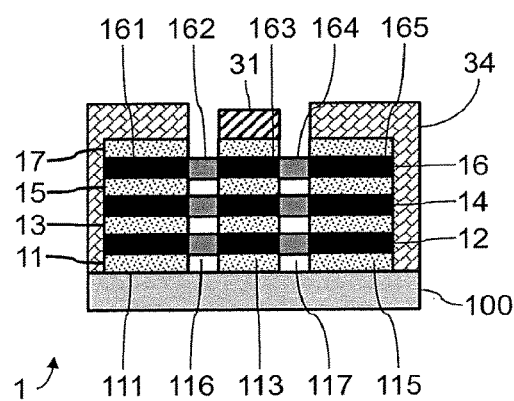

PROCESS FOR FABRICATING A FIELD EFFECT TRANSISTOR HAVING A COATING GATE

The invention relates to gate-wrap-around field-effect transistors, and in particular to processes for fabricating such transistors.

The increase in the performance of integrated circuits due to the miniaturization of field-effect transistors is confronted with a scientific and technological obstacle. One of the underlying problems is the increase in static and dynamic power in integrated circuits. In order to decrease this consumed power, new architectures and new materials that will allow a low operating voltage to be obtained are being intensively studied at the present time.

In particular, for technological nodes under 50 nm, electrostatic control of the channel by the gate becomes a key operating parameter with respect to the operation of the transistor. To improve this electrostatic control, various multiple-gate transistor technologies are being developed, in particular gate-wrap-around transistors. Moreover, it is known to compressively strain the channels of pMOS transistors or to tensilely strain the channels of nMOS transistors in their conduction direction, so as to improve the mobility of the carriers in these channels.

The following is a known process for fabricating a pMOS gate-wrap-around transistor. A stack of nanowires comprising in alternation silicon nanowires and silicon-germanium nanowires on a substrate is formed, so as to for example obtain compressively strained SiGe nanowires and relaxed silicon nanowires. A sacrificial gate is formed to cover the median portion of the stack of nanowires. Insulating spacers are also formed on either side of the sacrificial gate, in order to cover an intermediate median portion of the stack of nanowires. The channels of the transistor are intended to be formed in this median portion. Those portions of the nanowires of the stack which protrude beyond the spacers are not covered and are removed by etching. The SiGe nanowires are then relaxed and the silicon nanowires are then subject to a tensile strain.

The portion of the silicon-germanium nanowires under the spacers is removed by selective etching, so as to form cavities under these spacers. Internal spacers are then deposited in the interior of the cavities. In a step of growing silicon-germanium by epitaxy, a source and a drain are formed on either side of the stack. The source and the drain formed by epitaxy then make contact and are aligned with the silicon nanowires that were preserved under the sacrificial gate and the spacers. The source and drain are then encapsulated in an encapsulating or passivating material. A groove is then formed level with the sacrificial gate and the sacrificial gate is removed. The residual stack of nanowires is then uncovered. By selective etching, the silicon-germanium nanowires are removed. A gate insulator is then deposited on the uncovered portion of the silicon nanowires, then a gate material is formed on the gate insulator in order to encapsulate the median portion of these nanowires. At the end of this fabricating process, the silicon nanowires remain slightly tensilely strained in the channel, this degrading the performance of the pMOS transistor.

Similarly, for an sSOI nMOS transistor or a transistor based on an SRB layer, a similar fabricating process leads to a relaxation of the silicon of the channel, despite an initial tensile prestrain in the silicon nanowires. The performance of such an nMOS transistor is therefore degraded.

The subsequent formation of the source and drain by epitaxy does not allow the desired strain to be obtained in the channel zone of the silicon nanowires.

Document PCT/US2011/067232 describes a process for fabricating transistors, resulting in the formation of internal spacers. Moreover, this process includes depositing semiconductor by epitaxy level with sources and drains of these transistors.

The positioning of each internal spacer with respect to a sacrificial gate is quite poorly defined during the fabricating process. In addition, the width of the internal spacer is quite poorly controlled. Therefore, the strain in the channel zones of the nanowires is poorly controlled. The performance of the transistors thus formed may then exhibit high levels of dispersion.

There is therefore a need for a process for fabricating a gate-wrap-around field-effect transistor intended to obtain a significant strain in its channels. The invention aims to overcome one or more of these drawbacks. Thus, the invention relates to a process for fabricating a gate-wrap-around field-effect transistor such as defined in the appended claims.

Other features and advantages of the invention will emerge clearly from the description thereof that is given hereinafter, by way of indication and without limitation, with reference to the appended drawings, in which:

FIGS. 1 to 28 illustrate a transistor during various steps of its fabricating process, according to one example of one embodiment of the invention.

The invention provides a process for fabricating a gate-wrap-around field-effect transistor allowing, on the one hand, internal spacers to be formed when a segment of the nanowires, that extends from a source zone to a drain zone and includes a channel zone, is preserved, and, on the other hand, allowing a high prestrain to be obtained in the interior of these channel zones. Generally, a tensile prestrain will be maintained in the channel zone of an nMOS transistor and a compressive prestrain in the channel zone of a pMOS transistor.

FIGS. 1 to 28 illustrate a transistor 1 in various steps of its fabricating process, according to one example embodiment of the invention. The fabricating process is here applied for a nMOS transistor. The steps described with reference to FIGS. 1 to 5 are known per se by those skilled in the art and given by way of nonlimiting example of how to obtain a superposition of nanowires with a sacrificial gate.

FIG. 1 shows a substrate, illustrated in perspective. In the example detailed here, the substrate may for example be an sSOI substrate (sSOI standing for strained silicon-on-insulator) or an SRB substrate (SRB standing for strain relaxed buffer), in a way known per se. The substrate is here a semiconductor-on-insulator substrate.

The substrate here comprises an insulating layer 100 covered with a semiconductor layer 101. The semiconductor layer 101 is here a relaxed SiGe layer. For an SRB substrate, the insulating layer 100 will for example be replaced with a relaxed SiGe layer covered with a silicon layer typically strained with a biaxial tensile strain.

Figure 2:
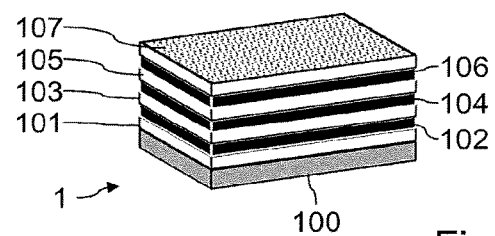

In FIG. 2, a superposition of layers 102 to 107 has been formed on the SiGe layer 101. Thus an alternation of SiGe layers 101, 103, 105 and 107, and silicon layers 102, 104 and 106 has been formed. The layers 102 to 107 are typically formed in sequential steps of epitaxial deposition. As is known per se, because of differences in lattice parameters between the silicon layers 102, 104 and 106, and the SiGe layers 101, 103, 105 and 107, a tensile strain is induced in the layers made of silicon 102, 104 and 106.

The thickness of the layers 101, 103, 105 and 107 is for example comprised between 5 and 15 nm and is preferably at most 10 nm. This thickness is for example 7 nm. The thickness of the layers 102, 104 and 106 is for example comprised between 5 and 15 nm and is preferably at most 10 nm. This thickness is for example 9 nm.

Figure 3:
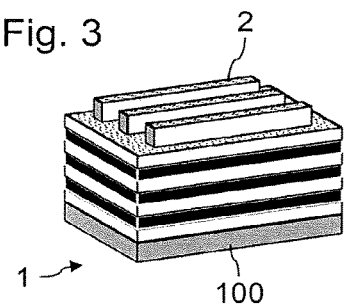
Figure 4:
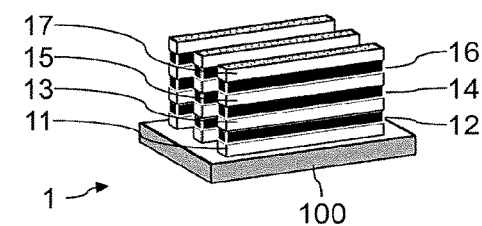

In FIG. 3, a mask 2 has been formed on the superposition of the layers 101 to 107, for example by photolithography. In FIG. 4, the layers 101 to 107 have been etched so as to form superpositions or stacks of adjacent nanowires. Each superposition or stack of nanowires includes a superposition of nanowires 11 to 17. The nanowires 11 to 17 extend in a longitudinal direction, and thus have a length at least two times larger than their width or their height. The nanowires 11, 13, 15 and 17 are here made of SiGe, for example $Si_{(1-x)}Ge_x$ where $0.2<x<0.6$. The value $x=0.3$ may for example be taken. The nanowires 12, 14 and 16 are here made of silicon. The mask 2 has been removed from the stacks. The width of each stack is for example comprised between 10 and 50 nanometers. The stacks of nanowires here include 7 superposed nanowires. A different number of superposed nanowires may of course be used. The height of the stacks of nanowires is for example comprised between 30 and 100 nanometers. At this stage, the SiGe nanowires 11, 13, 15 and 17 are relaxed and the silicon nanowires 12, 14 and 16 are tensilely strained.

Figure 5:
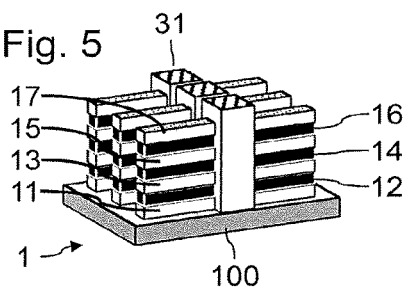

In FIG. 5, a sacrificial gate 31 has been formed for each of the stacks of nanowires. Each sacrificial gate 31 is wrapped around the median portion of a respective stack of nanowires. The sacrificial gate 31 for example comprises a protective layer of a thickness comprised between 1 nm and 3 nm of $SiO_2$ making contact with the nanowires, this layer being covered by a layer of poly-Si. The sacrificial gate 31 may also be formed (nonlimitingly) by a single layer of $SiO_2$. The process for forming and shaping each sacrificial gate 31 is known per se. The gate length of a transistor to be formed is defined by the length over which a sacrificial gate 31 is wrapped around a respective stack of nanowires.

Figure 6:
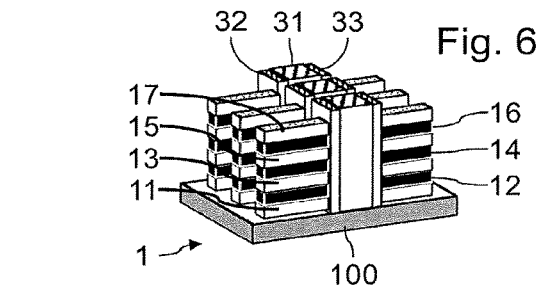

In FIG. 6, sacrificial spacers 32 and 33 have been formed on either side of each of the sacrificial gates 31. The sacrificial spacers 32 are each wrapped around a respective stack of nanowires level with its median portion, on one side of a respective sacrificial gate 31. The sacrificial spacers 33 are each wrapped around a respective stack of nanowires level with its median portion, on the other side of a respective sacrificial gate 31. The process for forming and shaping each sacrificial spacer 32, 33 is known per se. The width of each of the sacrificial spacers 32 or 33 is for example comprised between 3 and 15 nm. The sacrificial spacers 32, 33 are for example made of dielectric. The sacrificial spacers 32 or 33 are for example made of SiN, SiOCH, SiOCN or of SiBCN. The ends of the stacks of nanowires remain exposed.

Figure 7:
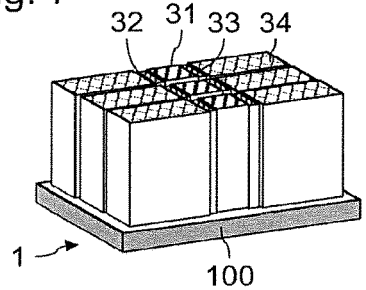
Figure 8:
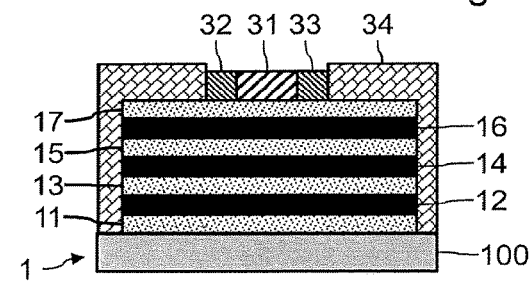

In FIG. 7, the ends of the nanowires have been encapsulated in an encapsulating material 34 using a deposition process that is known per se. An access is provided to the upper face of the sacrificial gates 31 and to the upper face of the sacrificial spacers 32 and 33. FIG. 8 is a longitudinal cross-sectional view level with one of the stacks of nanowires. At this stage, the nanowires 11 to 17 are preserved in their entirety, under the passivating material 34, under the sacrificial spacers 32 and 33, and under the sacrificial gate 31. Because of the continuity of these nanowires between their ends, over the entire stack, the tensile strains induced in the silicon nanowires 12, 14, 16 and 18 are preserved.

In FIG. 9, a step of removing the sacrificial spacers 32 and 33 has been carried out. This removal is here achieved by selectively etching the sacrificial spacers 32 and 33. For sacrificial spacers 32 and 33 made of SiN, the removal may for example be achieved by wet etching in orthophosphoric acid ($H_3PO_4$). Grooves 321 and 331 are thus formed on either side of each of the sacrificial gates 31. As better illustrated in FIG. 10, an intermediate median portion of the stacks of nanowires is thus exposed, on either side of the sacrificial gates 31.

In FIG. 11, the exposed portions of the nanowires plumb with the grooves 321 and 331 are here subjected to ion implantation, other chemical consumption methods being detailed below. It is possible for example to perform an ion implantation of silicon, with a view to making the exposed SiGe amorphous, or at least to make it richer in defects. The ion implantation here aims to make the SiGe nanowires 11, 13, 15 and 17 amorphous or to modify their crystal lattice plumb with the grooves 321 and 331. Each nanowire 11 to 17 is then disassociated between:

a first end housed under the passivating material 34. This first end is not impacted (or if it is, only marginally) by the ion implantation step;

an intermediate portion that is exposed in the groove 321. This intermediate portion corresponds to the reference 112 for the SiGe nanowire 11. This intermediate portion corresponds to the reference 162 for the silicon nanowire 16;

an intermediate channel portion that is lodged under the sacrificial gate 31. This intermediate portion is not impacted (or if it is, only marginally) by the ion implantation step. This intermediate portion corresponds to the reference 113 for the SiGe nanowire 11. This intermediate portion corresponds to the reference 163 for the silicon nanowire 16;

an intermediate portion that is exposed in the groove 331. This intermediate portion corresponds to the reference 114 for the SiGe nanowire 11. This intermediate portion corresponds to the reference 164 for the silicon nanowire 16;

a second end lodged under the passivating material 34. This second end is not impacted (or if it is, only marginally) by the ion implantation step. This second end corresponds to the reference 115 for the SiGe nanowires 11. This second end corresponds to the reference 165 for the silicon nanowire 16.

The zones of the SiGe that were subject to the ion implantation then become particularly sensitive to subsequent selective etching. The ion implantation here takes advantage of the different amorphization thresholds of silicon and germanium. The ion implantation thus allows the intermediate portions of the SiGe nanowires to be amorphized without resulting in an amorphization of the intermediate portions of the silicon nanowires.

In order to implant ions into the intermediate portions of the SiGe nanowires at various levels in the stack, the ion implantation may be carried out in a plurality of steps, with different ionization energies. The ionization energies will for example be designed to achieve a peak of defects level with a targeted respective intermediate portion of an SiGe nanowire. It is for example possible to envision carrying out an ion implantation using Si, P, Ar and Ge.

In FIG. 12, intermediate portions of the SiGe nanowires 11, 13, 15 and 17 have been removed. This removal is achieved by selectively etching the SiGe which has been made amorphous, plumb with the grooves 321 and 331. The ends and the median portion of the SiGe nanowires 11, 13, 15 and 17 remaining masked by the passivating material 34 and the sacrificial gate 31 not having been affected by the ion implantation, the etching of the SiGe of the intermediate portions being very selective. The removed intermediate portions of the SiGe nanowires 11, 13, 15 and 17 leave behind voids. The nanowire 11 thus includes voids 116 and 117 on either side of its median portion 113. The nanowire 16 thus includes voids above and below its intermediate portions 162 and 164.

Advantageously, the intermediate portions of the silicon nanowires 12, 14 and 16 may be doped after the intermediate portions of the SiGe nanowires 11, 13, 15 and 17 have been removed. Appropriate doping of the intermediate portions of the silicon nanowires allows the electrical performance of the transistors to be formed to be improved. Such doping may for example be carried out by plasma immersion or by an ion-rich deposition able to diffuse into the intermediate portions of the silicon nanowires.

Figure 13:
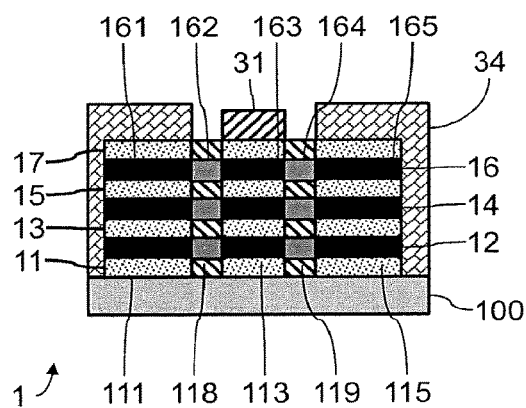

In FIG. 13, the voids produced beforehand have been at least partially filled with a dielectric, so as to form internal spacers. Thus, the voids 116 and 117 of the nanowire 11 are here replaced by internal spacers 118 and 119. Advantageously, it is also possible to fill the voids formed only partially, so as to preserve an air gap. Such partial filling may for example be achieved by atomic layer deposition (ALD). Such air gaps allow the dielectric constant of the spacers to be decreased. Such partial filling nonetheless allows a material to be kept between the air and the median portion under the gate in order to prevent this cavity from being filled in subsequent steps. Each intermediate portion of a silicon nanowire 12, 14 or 16 is thus placed between two internal spacers in a direction normal to the substrate 100. The internal spacers are made of dielectric, for example of a low-dielectric-constant dielectric (dielectric constant typically lower than 4). The internal spacers are for example made of SiBCN, SiOCN or SiOCH. The internal spacers are typically made from a material that etches very selectively with respect to the other materials used to form the transistor (for example polysilicon and TiN for the gate, $SiO_2$ for a passivating/encapsulating material, etc.).

Figure 14:
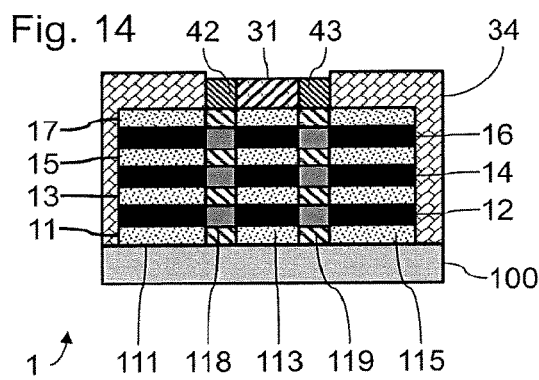
Figure 15:
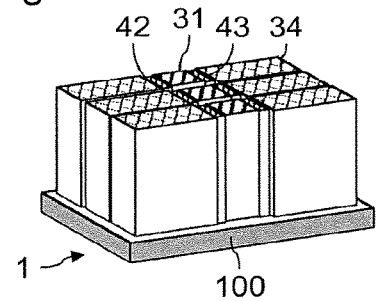

In FIGS. 14 and 15, spacers 42 and 43, provided on either side of the sacrificial gate 31, have been wrapped around the intermediate portions of the nanowires and the dielectric spacers. The spacers 42 and 43 are advantageously made of a low-dielectric-constant dielectric. The spacers 42 and 43 are for example made of SiBCN or SiOCH. Consequently, an insulation has been created between the sacrificial gate 31 and the ends of the stacks of nanowires. As a variant, it is also possible to form the spacers 42 and 43 from the same material and in the same processing phase as the internal spacers.

Figure 16:
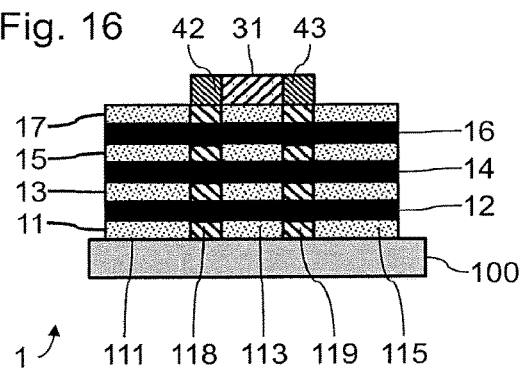
Figure 17:
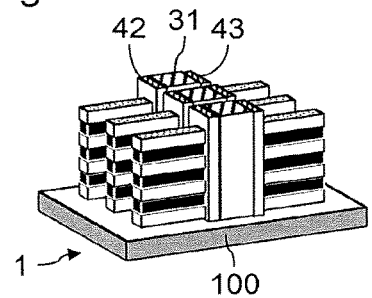

In FIGS. 16 and 17, the passivating material 34 has been removed in order to expose the ends of the nanowires 11 to 17. The internal spacers, the spacers 42 and 43 and the sacrificial gate 31 are preserved.

Figure 18:
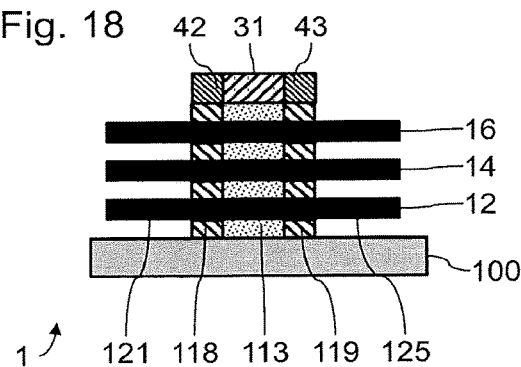
Figure 19:
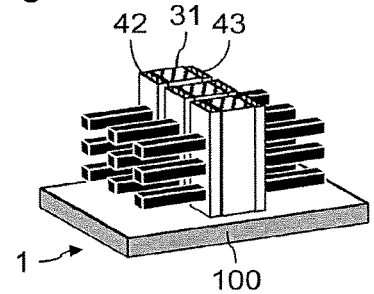

In FIGS. 18 and 19, the ends of the SiGe nanowires 11, 13, 15 and 17 have been removed. This removal of the ends is achieved selectively with respect to the ends of the nanowires 12, 14 and 16 made of silicon and with respect to the spacers and the sacrificial gate 31. The ends of the nanowires 12, 14 and 16 made of silicon are then relaxed. The nanowires 12, 14 and 16 are thus preserved continuously between their median portion and their first and second ends.

At this stage, the intermediate portions of the SiGe nanowires 11, 13, 15 and 17 remain relaxed and the intermediate portions of the nanowires 12, 14 and 16 made of silicon remain tensilely strained. The ends of the nanowires 12, 14 and 16 made of silicon are relaxed by removing the ends of the SiGe nanowires 11, 13, 15 and 17.

Figure 20:
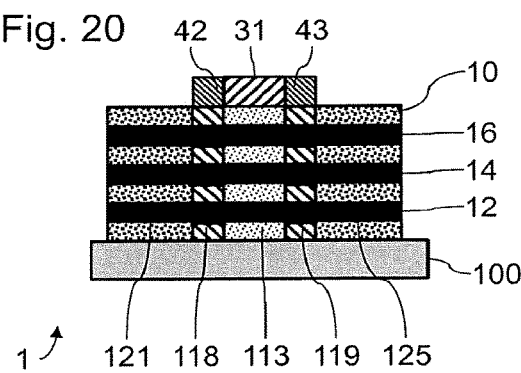
Figure 21:
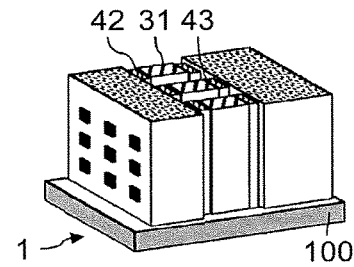

In FIGS. 20 and 21, an SiC:P deposit 10 has been formed by epitaxy on either side of the spacers 42 and 43. This deposit is formed around the ends of the nanowires 12, 14 and 16. The deposit 10 thus fills the voids obtained by selectively removing the ends of the SiGe nanowires 11, 13, 15 and 17. The presence of the ends of the nanowires 12, 14 and 16 promotes the growth of the deposit 10 by epitaxy in a plurality of directions. The epitaxial deposition is in particular formed around the first and second ends of the nanowires 12, 14 and 16.

This deposit of SiC doped in situ with phosphorus allows, on the one hand, n-type dopants to be included in the source and drain of the nMOS transistor to be formed. On the other hand, because of its lattice parameter, the epitaxial growth of the SiC from the ends of the nanowires 12, 14 and 16 that remained exposed will induce a longitudinal tensile strain in these nanowires 12, 14 and 16. The longitudinal tensile strain in the median zone of the nanowires 12, 14 and 16 (corresponding to the channel zone of the nMOS transistor to be formed) is then increased. A longitudinal compressive strain appears in the median zone of the SiGe nanowires 11, 13, 15, and 17.

Figure 22:
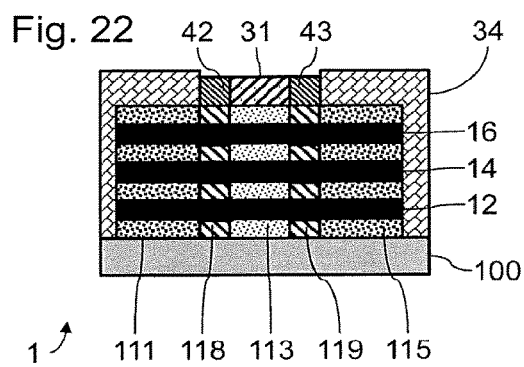
Figure 23:
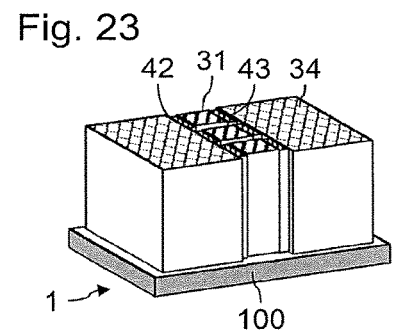

In FIGS. 22 and 23, the ends of the nanowires 12, 14 and 16 and the deposit 10 have been encapsulated in a passivating material 34.

Figure 24:
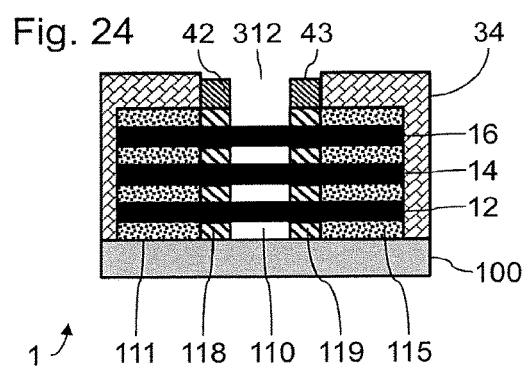
Figure 25:
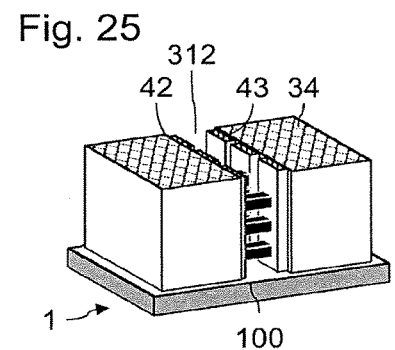

In FIGS. 24 and 25, the sacrificial gate 31 has been removed in order to produce a groove 312 and thus an access to the median portions of the nanowires 11 to 17. The removal of the sacrificial gate 31 has for example been achieved using an etch that is selective with respect to the material of the spacers 42 and 43.

The median portion of the nanowires 11, 13, 15 and 17 were then selectively etched while preserving the median portion of the nanowires 12, 14 and 16. The median portion of the nanowires 12, 14 and 16 (which corresponds to the channel zones of the gate-wrap-around transistor in the process of being formed) preserves its longitudinal tensile strain. Because voids have been formed in replacement of the median portions of the nanowires 11, 13, 15 and 17, an access to all the faces of the median portions of the nanowires 12, 14 and 16 is thus formed. The internal spacers 118 and 119, and the spacers 42 and 43 allow the intermediate portions of the nanowires 12, 14 and 16 to be protected during this selective etching of the SiGe of the median portions of the nanowires 11, 13, 15 and 17.

Figure 26:
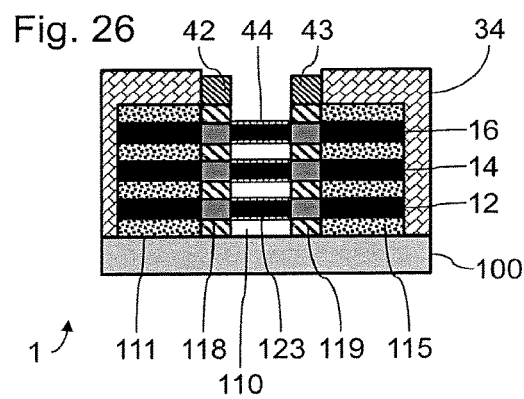

In FIG. 26, a gate insulator 44 has been formed around the median portions of the nanowires 12, 14 and 16. The gate insulator of each nanowire 12, 14 and 16 may for example comprise an interfacial oxide layer making contact with the nanowire, which layer is surmounted with a dielectric layer wrapped around this interfacial layer. The dielectric layer may for example be made of $HfO_2$.

Figure 27:
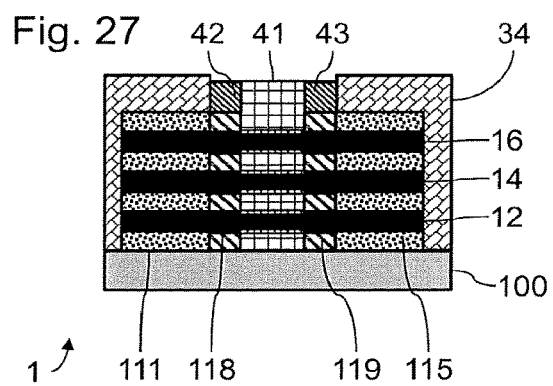
Figure 28:
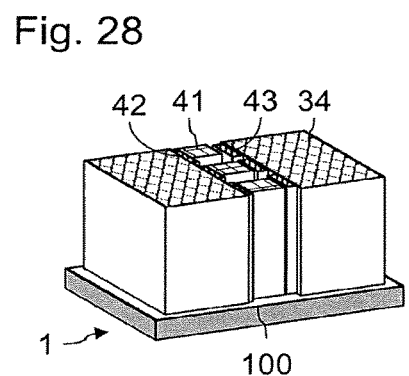

In FIGS. 27 and 28, a wrap-around gate 41 has been formed by filling the voids encircling the median portions of the nanowires 12, 14 and 16 and the gate insulators 44. The wrap-around gate 41 may for example be produced in a way known per se by depositing a gate metal or by depositing highly doped TiN or polysilicon.

In the described examples, the intermediate portions of the SiGe nanowires have been removed by ion implantation followed by etching. It is also possible to envisage removing the intermediate portions of sacrificial nanowires with an etch according to the crystal planes of these nanowires. For example, it is possible to carry out a chemical etch that etches at a high rate crystal planes of low density and at a low rate crystal planes that are denser. It is for example possible to etch crystal planes of SiGe with hydrochloric acid.

The described example includes a superposition of layers of silicon and of silicon-germanium with a view to creating channel zones that are strained with a longitudinal tensile strain. However, it is also possible to envisage other types of semiconductors in this superposition, provided that one of the semiconductors is suitable for forming the channel of a transistor, that its superposition with the other semiconductor induces tensile prestrains in the channel zone for an nMOS transistor (or compressive prestrains for a pMOS transistor), and that the two semiconductors can be etched selectively with respect to each other. It is also for example possible to envisage producing a superposition of nanowires of III-V semiconductors, for example of InAs and InGaAs. The superposition of the nanowires may include nanowires made of at least three different semiconductors.

According to another variant, it is possible to obtain a tensile strain in the channel zone of nMOS transistors using nanowires the intermediate zone of which is initially not strained.

In the step illustrated in FIG. 1, an upper layer 100 of a bulk-semiconductor or SOI (silicon-on-insulator) substrate is provided. The semiconductor layer 101 formed on the layer 100 is here an SiGe layer including a biaxially compressive strain.

In the step illustrated in FIG. 2, in this variant a superposition of layers 102 to 107 has been formed on the SiGe layer 101. Thus an alternation of SiGe layers 101, 103, 105 and 107, and silicon layers 102, 104 and 106 has been formed. The layers 102 to 107 are typically formed in sequential steps of epitaxial deposition. As is known per se, because of differences in lattice parameters between the silicon layers 102, 104 and 106, and the SiGe layers 101, 103, 105 and 107, the layers made of silicon 102, 104 and 106 are relaxed.

The thickness of the layers 101, 103, 105 and 107 is for example comprised between 5 and 15 nm and is preferably at most 10 nm. This thickness is for example 7 nm. The thickness of the layers 102, 104 and 106 is for example comprised between 5 and 15 nm and is preferably at most 10 nm. This thickness is for example 9 nm.

In the step illustrated in FIG. 3, in this variant a mask 2 has been formed on the superposition of the layers 101 to 107, for example by photolithography. In FIG. 4, the layers 101 to 107 have been etched so as to form superpositions or stacks of adjacent nanowires. Each superposition or stack of nanowires includes a superposition of nanowires 11 to 17. The nanowires 11 to 17 extend in a longitudinal direction, and thus have a length at least two times larger than their width or their height. The nanowires 13, 15 and 17 are here made of SiGe, for example $Si_{(1-x)}Ge_x$ where $0.2<x<0.6$. The value $x=0.3$ may for example be taken. The nanowires 12, 14 and 16 are here made of silicon. The mask 2 has been removed from the stacks. The width of each stack is for example comprised between 10 and 50 nanometers. The stacks of nanowires here include 7 superposed nanowires. A different number of superposed nanowires may of course be used. The height of the stacks of nanowires is for example comprised between 30 and 100 nanometers. At this stage, the SiGe nanowires 11, 13, 15 and 17 are compressively strained and the silicon nanowires 12, 14 and 16 are relaxed.

In FIG. 5, a sacrificial gate 31 has been formed for each of the stacks of nanowires, as in the variant described above.

In FIG. 6, sacrificial spacers 32 and 33 have been formed on either side of each of the sacrificial gates 31, as in the variant described above.

In FIG. 7, the ends of the nanowires have been encapsulated in an encapsulating material 34, as in the variant described above. At the stage illustrated in FIG. 8, the nanowires 11 to 17 are preserved in their entirety, under the passivating material 34, under the sacrificial spacers 32 and 33, and under the sacrificial gate 31, as in the variant described above. Because of the continuity of these nanowires between their ends, over the entire stack, the compressive strains induced in the SiGe nanowires 11, 13, 15 and 17 are preserved and the relaxation in the silicon nanowires 12, 14 and 16 is preserved.

In FIG. 9, a step of removing the sacrificial spacers 32 and 33 has been carried out, as in the variant described above. As better illustrated in FIG. 10, an intermediate median portion of the stacks of nanowires is thus exposed, on either side of the sacrificial gates 31.

In FIG. 11, the exposed portions of the nanowires plumb with the grooves 321 and 331 are here the subject of a silicon-ion implantation, with a view to making the exposed SiGe amorphous, or at least to making it rich in defects, as in the variant described above. Each nanowire 11 to 17 is then disassociated between:

- a first end lodged under the passivating material 34 and not impacted by the ion implantation step;
- an intermediate portion that is exposed in the groove 321, corresponding to the reference 112 for the SiGe nanowire 11 and corresponding to the reference 162 for the silicon nanowire 16;
- an intermediate channel portion lodged under the sacrificial gate 31 and not impacted by the ion implantation step, corresponding to the reference 113 for the SiGe nanowire 11 and corresponding to the reference 163 for the silicon nanowire 16;
- an intermediate portion that is exposed in the groove 331, corresponding to the reference 114 for the SiGe nanowire 11 and corresponding to the reference 164 for the silicon nanowire 16;
- a second end lodged under the passivating material 34 and not impacted by the ion implantation step, corresponding to the reference 115 for the SiGe nanowires 11 and corresponding to the reference 165 for the silicon nanowire 16;

The zones of the SiGe that were subject to the ion implantation then become particularly sensitive to subsequent selective etching, as detailed above. The ion implantation may be carried out with the parameters detailed for the variant described above.

In FIG. 12, the intermediate portions of the SiGe nanowires 11, 13, 15 and 17 have been removed, as in the variant described above. The removed intermediate portions of the SiGe nanowires 11, 13, 15 and 17 leave behind voids. The nanowire 11 thus includes voids 116 and 117 on either side of its median portion 113. The nanowire 16 thus includes voids above and below its intermediate portions 162 and 164.

The intermediate portions of the silicon nanowires 12, 14 and 16 may be doped after the intermediate portions of the SiGe nanowires 11, 13, 15 and 17 have been removed, as in the variant described above.

In FIG. 13, the voids produced beforehand have been at least partially filled with a dielectric, in order to form the internal spacers 118 and 119, as in the variant described above. Each intermediate portion of a silicon nanowire 12, 14 or 16 is thus placed between two internal spacers in a direction normal to the substrate 100.

In FIGS. 14 and 15, spacers 42 and 43, provided on either side of the sacrificial gate 31, have been wrapped around the intermediate portions of the nanowires and the dielectric spacers, as in the variant described above.

In FIGS. 16 and 17, the passivating material 34 has been removed, in order to expose the ends of the nanowires 11 to 17, the internal spacers, the spacers 42 and 43 and the sacrificial gate 31 being preserved as in the variant described above.

In FIGS. 18 and 19, the ends of the SiGe nanowires 11, 13, 15 and 17 have been removed, as in the variant described above. The ends of the nanowires 12, 14 and 16 made of silicon are then relaxed.

At this stage, the intermediate portions of the SiGe nanowires 11, 13, 15 and 17 remain relaxed and the intermediate portions of the nanowires 12, 14 and 16 made of silicon remain tensilely strained. The ends of the nanowires 12, 14 and 16 made of silicon are relaxed by removing the ends of the SiGe nanowires 11, 13, 15 and 17.

In FIGS. 20 and 21, an SiC:P deposition 10 has been formed by epitaxy on either side of the spacers 42 and 43, as in the variant detailed above, the deposition 10 thus filling the voids obtained by selectively removing the ends of the SiGe nanowires 11, 13, 15 and 17.

This deposit of SiC doped in situ with phosphorus allows, on the one hand, n-type dopants to be included in the source and drain of the nMOS transistor to be formed. On the other hand, because of its lattice parameter, the epitaxial growth of the SiC from the ends of the nanowires 12, 14 and 16 that remained exposed will induce a longitudinal tensile strain in these nanowires 12, 14 and 16. A longitudinal tensile strain appears in the median zone of the nanowires 12, 14 and 16 (corresponding to the channel zone of the nMOS transistor to be formed). The longitudinal compressive strain decreases in the median zone of the SiGe nanowires 11, 13, 15, and 17.

In FIGS. 22 and 23, the ends of the nanowires 12, 14 and 16 and the deposit 10 have been encapsulated in a passivating material 34.

In FIGS. 24 and 25, the sacrificial gate 31 has been removed in order to produce a groove 312 and thus an access to the median portions of the nanowires 11 to 17. The removal of the sacrificial gate 31 has for example been achieved using an etch that is selective with respect to the material of the spacers 42 and 43.

Next, the median portion of the nanowires 11, 13, 15 and 17 is selectively etched while preserving the median portion of the nanowires 12, 14 and 16, as in the variant described above, the median portion of the nanowires 12, 14 and 16 preserving its longitudinal tensile strain.

In FIG. 26, a gate insulator 44 has been formed around the median portions of the nanowires 12, 14 and 16, as in the variant described above.

In FIGS. 27 and 28, a wrap-around gate 41 has been formed by filling the voids encircling the median portions of the nanowires 12, 14 and 16 and the gate insulators 44, as in the variant described above.

The invention has essentially been described above in its application to an nMOS transistor. According to one variant, it is possible to obtain a compressive strain in the channel zone of PMOS transistors.

In the step illustrated in FIG. 1, an upper layer 100 of a bulk-semiconductor or SOI (silicon-on-insulator) substrate is provided. The semiconductor layer 101 formed on the layer 100 is here an SiGe layer including a biaxially compressive strain.

In the step illustrated in FIG. 2, in this variant a superposition of layers 102 to 107 is formed on the SiGe layer 101, as in the variants described above.

In the step illustrated in FIG. 3, in this variant a mask 2 is formed on the superposition of the layers 101 to 107, for example by photolithography. In FIG. 4, the layers 101 to 107 have been etched so as to form superpositions or stacks of adjacent nanowires, as in the variants described above. At this stage, the SiGe nanowires 11, 13, 15 and 17 are compressively strained and the silicon nanowires 12, 14 and 16 are relaxed.

In FIG. 5, a sacrificial gate 31 has been formed for each of the stacks of nanowires, as in the variant described above. In FIG. 6, sacrificial spacers 32 and 33 have been formed on either side of each of the sacrificial gates 31, as in the variant described above.

In FIG. 7, the ends of the nanowires have been encapsulated in an encapsulating material 34, as in the variant described above. At the stage illustrated in FIG. 8, the nanowires 11 to 17 are preserved in their entirety, under the passivating material 34, under the sacrificial spacers 32 and 33, and under the sacrificial gate 31, as in the variant described above. Because of the continuity of these nanowires between their ends, over the entire stack, the compressive strains induced in the SiGe nanowires 11, 13, 15 and 17 are preserved and the relaxation in the silicon nanowires 12, 14 and 16 is preserved.

In FIG. 9, a step of removing the sacrificial spacers 32 and 33 has been carried out, as in the variants described above. As better illustrated in FIG. 10, an intermediate median portion of the stacks of nanowires is thus exposed, on either side of the sacrificial gates 31.

In FIG. 11, the exposed portions of the nanowires plumb with the grooves 321 and 331 are here the subject of a silicon-ion implantation, with a view to making the exposed SiGe amorphous, or at least to making it rich in defects, as in the variants described above. Each nanowire 11 to 17 is then disassociated between:
 a first end lodged under the passivating material 34 and not impacted by the ion implantation step;
 an intermediate portion that is exposed in the groove 321, corresponding to the reference 112 for the SiGe nanowire 11 and corresponding to the reference 162 for the silicon nanowire 16;
 an intermediate channel portion lodged under the sacrificial gate 31 and not impacted by the ion implantation step, corresponding to the reference 113 for the SiGe nanowire 11 and corresponding to the reference 163 for the silicon nanowire 16;
 an intermediate portion that is exposed in the groove 331, corresponding to the reference 114 for the SiGe nanowire 11 and corresponding to the reference 164 for the silicon nanowire 16;
 a second end lodged under the passivating material 34 and not impacted by the ion implantation step, corresponding to the reference 115 for the SiGe nanowire 11 and corresponding to the reference 165 for the silicon nanowire 16;

The zones of the SiGe that were subject to the ion implantation then become particularly sensitive to subsequent selective etching, as detailed above. The ion implantation may be carried out with the parameters detailed for the variants described above.

In FIG. 12, intermediate portions of the SiGe nanowires 11, 13, 15 and 17 have been removed, as in the variant described above. The removed intermediate portions of the SiGe nanowires 11, 13, 15 and 17 leave behind voids. The nanowire 11 thus includes voids 116 and 117 on either side of its median portion 113. The nanowire 16 thus includes voids above and below its intermediate portions 162 and 164.

The intermediate portions of the silicon nanowires 12, 14 and 16 may be doped after the intermediate portions of the SiGe nanowires 11, 13, 15 and 17 have been removed, as proposed in the variants described above.

In FIG. 13, the voids produced beforehand have been at least partially filled with a dielectric, in order to form the internal spacers 118 and 119, as in the variant described above. Each intermediate portion of a silicon nanowire 12, 14 or 16 is thus placed between two internal spacers in a direction normal to the substrate 100.

In FIGS. 14 and 15, spacers 42 and 43, provided on either side of the sacrificial gate 31, have been wrapped around the intermediate portions of the nanowires and the dielectric spacers, as in the variants described above.

In FIGS. 16 and 17, the passivating material 34 has been removed, in order to expose the ends of the nanowires 11 to 17, the internal spacers, the spacers 42 and 43 and the sacrificial gate 31 being preserved as in the variants described above.

In FIGS. 18 and 19, the ends of the SiGe nanowires 11, 13, 15 and 17 have been removed, as in the variants described above. The ends of the nanowires 12, 14 and 16 made of silicon are then relaxed.

At this stage, the intermediate portions of the SiGe nanowires 11, 13, 15 and 17 remain relaxed and the intermediate portions of the nanowires 12, 14 and 16 made of silicon remain tensilely strained. The ends of the nanowires 12, 14 and 16 made of silicon are relaxed by removing the ends of the SiGe nanowires 11, 13, 15 and 17.

In FIGS. 20 and 21, an SiGe deposit 10 has been formed by epitaxy on either side of the spacers 42 and 43. This deposit is formed around the ends of the nanowires 12, 14 and 16. The deposit 10 thus fills the voids obtained by selectively removing the ends of the SiGe nanowires 11, 13, 15 and 17. The presence of the ends of the nanowires 12, 14 and 16 promotes the growth of the deposit 10 by epitaxy in a plurality of directions.

This in situ deposition of SiGe by epitaxy on those ends of the nanowires 12, 14 and 16 which remain exposed allows, because of its lattice parameter, a longitudinal compressive strain to be induced in these depositions. This induces a longitudinal compressive strain in the median zone of the nanowires 12, 14 and 16 (corresponding to the channel zone of the pMOS transistor to be formed). The longitudinal compressive strain increases in the median zone of the SiGe nanowires 11, 13, 15, and 17.

In FIGS. 22 and 23, the ends of the nanowires 12, 14 and 16 and the deposit 10 have been encapsulated in a passivating material 34.

In FIGS. 24 and 25, the sacrificial gate 31 has been removed in order to produce a groove 312 and thus an access to the median portions of the nanowires 11 to 17. The removal of the sacrificial gate 31 has for example been achieved using an etch that is selective with respect to the material of the spacers 42 and 43.

The median portion of the nanowires 11, 13, 15 and 17 were then selectively etched while preserving the median portion of the nanowires 12, 14 and 16. The median portion of the nanowires 12, 14 and 16 sees its compressive longitudinal strain increase.

In FIG. 26, a gate insulator 44 has been formed around the median portions of the nanowires 12, 14 and 16, as in the variants described above.

In FIGS. 27 and 28, a wrap-around gate 41 has been formed by filling the voids encircling the median portions of the nanowires 12, 14 and 16 and the gate insulators 44, as in the variants described above.

In the examples described above, the nanowires have a substantially square cross section. Other cross sections may of course be envisaged, for example ovoid, trapezoidal, or rectangular. Nanowires taking the form of nanosheets may for example be used, and thus have a cross section in which the width is at least equal to 2 times the height.

In the examples described above, the superposition included seven nanowires. Provision may also be made for a superposition of any suitable number of nanowires at least equal to 2.

The invention claimed is:

1. A process for fabricating a gate-wrap-around field-effect transistor, comprising:
    providing a substrate surmounted with a superposition of first to third nanowires each having a median portion and first and second ends on either side of the median portion along a longitudinal axis thereof, each of the nanowires being made of a semiconductor, said second nanowire being disposed between the first and the third nanowires and being made of a semiconductor that is different from the semiconductor of the first nanowire and different from the semiconductor of the third nanowire, so that the first or the second nanowire is subjected to a mechanical strain along its longitudinal axis, the median portion of the first to third nanowires being covered by a sacrificial gate, electrical insulator being wrapped around a portion of the second nanowire intermediate between its median portion and its first end and between its median portion and its second end, the electrical insulator separating the first end from the median portion of the first and the third nanowires, and separating the second end from the median portion of the first and the third nanowires;
    removing the first and the second ends of the first and the third nanowires selectively with respect to the first and the second ends of the second nanowire, so as to preserve the second nanowire to be continuous between its median portion and its first and second ends;
    depositing a semiconductor that is different from that of the first to the third nanowires, by epitaxial growth from and around the first and the second ends of the second nanowire, so as to modify the mechanical strain in the median portion of the second nanowire; then
    removing the sacrificial gate, and removing the median portion of the first and the third nanowires; and
    forming a gate electrode wrapped around the median portion of the second nanowire.

2. The process for fabricating a gate-wrap-around field-effect transistor according to claim 1, wherein the first to the third provided nanowires include silicon, and the first and the third nanowires including a proportion of germanium higher than that of the second nanowire.

3. The process for fabricating a gate-wrap-around field-effect transistor according to claim 2, wherein the first and the third provided nanowires are made of $Si_{(1-x)}Ge_x$, where $0.2<x<0.6$.

4. The process for fabricating a gate-wrap-around field-effect transistor according to claim 2, wherein the deposited semiconductor is SiC doped in situ with phosphorus.

5. The process for fabricating a gate-wrap-around field-effect transistor according to claim 2, wherein the deposited semiconductor is SiGe doped in situ with boron.

6. The process for fabricating a gate-wrap-around field-effect transistor according to claim 5, wherein the deposited semiconductor has a germanium concentration higher than that of the first and the third nanowires.

7. The process for fabricating a gate-wrap-around field-effect transistor according to claim 1, wherein the second nanowire of the provided substrate is relaxed.

8. The process for fabricating a gate-wrap-around field-effect transistor according to claim 1, wherein the second nanowire of the provided substrate is tensile-strained along its longitudinal axis.

9. The process for fabricating a gate-wrap-around field-effect transistor according to claim 1, further comprising prior steps of:
removing intermediate portions of the first and the third initially continuous nanowires, between their first end and their median portion, and between their second end and their median portion; and
depositing the electrical insulator.

10. The process for fabricating a gate-wrap-around field-effect transistor according to claim 9, wherein the step of removing the intermediate portions of the first and the third nanowires comprises an implantation of ions into these intermediate portions and then a step of selectively etching these portions.

11. The process for fabricating a gate-wrap-around field-effect transistor according to claim 9, wherein the step of removing the intermediate portions of the first and the third nanowires comprises etching the intermediate portions of the first and the third nanowires according to their crystal planes.

12. The process for fabricating a gate-wrap-around field-effect transistor according to claim 1, further comprising a step of doping the second nanowire in a portion that is intermediate between its first end and its median portion and in a portion that is intermediate between its second end and its median portion, after the step of providing the substrate and before the step of removing the sacrificial gate.

13. The process for fabricating a gate-wrap-around field-effect transistor according to claim 1, wherein the first to the third provided nanowires have a thickness at most equal to 15 nm.

14. The process for fabricating a gate-wrap-around field-effect transistor according to claim 1, wherein the electrical insulator for the provided substrate has a thickness comprised between 3 nm and 15 nm between the first end and the median portion of the first and the third nanowires.

* * * * *